United States Patent [19]

Ong

[11] Patent Number: 5,371,042
[45] Date of Patent: Dec. 6, 1994

[54] METHOD OF FILLING CONTACTS IN SEMICONDUCTOR DEVICES

[75] Inventor: Edith Ong, Saratoga, Calif.

[73] Assignee: Applied Materials, Inc., Santa Clara, Calif.

[21] Appl. No.: 899,563

[22] Filed: Jun. 16, 1992

[51] Int. Cl.$^5$ .................................. H01L 21/283
[52] U.S. Cl. .................... 437/194; 437/203; 437/192
[58] Field of Search .............. 437/203, 187, 194, 195, 437/190, 192

[56] References Cited

U.S. PATENT DOCUMENTS

| | | | |
|---|---|---|---|
| 4,724,060 | 2/1988 | Sakata et al. | 204/298 |
| 4,824,544 | 4/1989 | Mikalesen et al. | 204/298 |
| 4,962,414 | 11/1990 | Liou et al. | 437/200 |
| 4,994,162 | 2/1991 | Armstrong et al. | 204/192.15 |
| 5,049,975 | 9/1991 | Ajika et al. | 257/764 |
| 5,171,412 | 12/1992 | Talieh et al. | 204/192.15 |
| 5,232,871 | 8/1993 | Ho | 437/190 |

FOREIGN PATENT DOCUMENTS

| | | |
|---|---|---|
| 387835 | 9/1990 | European Pat. Off. . |
| 310965 | 12/1988 | Japan . |

OTHER PUBLICATIONS

Inoue et al, "The properties of aluminum thin films . . . ", J. Vac Sci Technol. A6(3) May/Jun. 1988.
Chen et al, "Planarized Aluminum Metallization . . . ", IEDM 90-51, pp. 3.4.1-3.4. (Apr. 1990).
Author Unknown, "Endura 500 PVD" System Specifications, Applied Materials, Inc (Apr/1990).
Nicolet et al, "Diffusion barriers" J. Vac Sci. Technol. vol. 19 No. 3 Sep./Oct. 1981, pp. 786-793.
Stimmell, "Properties of dc magnetron" J. Vac. Sci. Technol. B 4(6) Nov./Dec. 1986, pp. 1377-1382.

*Primary Examiner*—Olik Chaudhuri
*Assistant Examiner*—C. Everhart
*Attorney, Agent, or Firm*—Birgit E. Morris

[57] ABSTRACT

An improved method of filling vias and openings in semiconductor devices comprises first faceting the top of the openings, depositing in sequence a barrier layer, as of TiN, treating the barrier layer to reduce its porosity, depositing a titanium-containing wetting layer, sputter depositing a first layer of aluminum at low temperatures and sputter depositing a second layer of aluminum at high temperatures to fill the opening and planarize the layer. The improved method is carried out preferably in a multichamber sputtering system.

17 Claims, 7 Drawing Sheets

METHOD OF FILLING CONTACTS IN SEMICONDUCTOR DEVICES

This invention relates to a method of depositing metal layers in the manufacture of semiconductor devices. More particularly, this invention relates to filling openings of high aspect ratio in the manufacture of microelectronic devices.

BACKGROUND OF THE INVENTION

In the manufacture of semiconductor devices, metal contacts are deposited onto silicon wafers that have been processed to form devices connected to each other by the metal contacts to form an integrated circuit. In particular, aluminum or aluminum alloy lines have been deposited into vias and openings such as trenches or grooves, formed in a layer such as silicon oxide. This method has long been used and is effective. However, as devices have been made smaller, openings must also be made smaller, and the openings to be filled have higher aspect ratios, i.e., the depth of an opening divided by its width is higher.

Difficulties have been encountered in depositing aluminum lines and contacts by conventional sputtering processes when submicron high aspect ratio openings are to be filled. As the openings become smaller and deeper, the bottom and sides of an opening receive fewer deposited metal ions than the top surface of the device, with the result that the metal layer hangs over the opening. Thus, over time, the bottom and sides of the opening receive even fewer deposited metal ions, and the overhang closes before the opening is filled, creating a void in the opening. This is illustrated in FIG. 1 wherein a deposited aluminum layer 3 overlies and overhangs an opening 5 in a silicon oxide layer 4.

Various techniques have been tried for depositing aluminum-containing layers in an attempt to improve step coverage. For example, combinations of varying sputtering rates and substrate temperatures have been tried in an effort to combine sputtering and melting of the aluminum-containing film so that the aluminum will at least partially melt and flow, thereby forming a continuous film in the opening. However, very high temperatures can damage devices already formed in the substrate or cause changes in other portions of the semiconductor devices in the substrate.

Sputtering chambers have been modified to reduce sputtering rates to allow aluminum atoms to move around and coalesce, but this also increases the time required to make a semiconductor device, which is costly. Further, such modification of existing equipment is also expensive.

Talieh et al in copending application Ser. No. 07/749,096 filed Aug. 23, 1991, "Material Deposition Method for Integrated Circuit Manufacturing", now U.S. Pat. No. 5,171,412 describes a two step sputter deposition process whereby in a first step a metal is deposited at low temperatures (up to about 100° C.) using a collimation grating to improve the directionality of sputtered ions and cover the bottom of openings and grooves in a substrate with a seed metal layer, and then sputter depositing the material without a collimation grating at high temperatures that will allow the metal to flow somewhat, thereby filling the openings and producing a planarized metal layer.

Another advance in the art of sputtering high aspect ratio vias and contacts was disclosed by Inoue et al. Their method comprises depositing aluminum films by sputtering at elevated temperatures. Aluminum/silicon films were deposited by magnetron sputtering. Vias etched into patterned 1 micron thick phosphosilicate glass layers were filled in and the temperature of the substrate maintained at about 530° C. Good step coverage and planarization was achieved. Reactive sputtering of a TiN barrier film about 0.1 micron thick further improved planarization of the above aluminum layer, probably by minimizing reaction between aluminum and the underlying silicon or silicon oxide and it prevented spiking of the aluminum into the silicon substrate.

More recently, a process was described by Chen that specifically addresses sputter deposition and planarization of aluminum for submicron openings. After formation of vertical wall contact openings in a borophosphosilicate glass layer, a first titanium nitride (TiN) barrier layer was deposited in the opening by reactive sputtering. An aluminum alloy layer ($AlSi_{1\%}Cu_{0.5\%}$) was sputter deposited to fill the openings at an elevated wafer temperature using conventional sputtering equipment. The deposition of a first TiN barrier layer allowed smooth, planarized aluminum films to be deposited while completely filling high aspect ratio openings.

However, none of the above processes is completely effective to fill in submicron size vias and openings of high aspect ratio without the formation of voids and with planarization of the metal layers, in an economically viable process.

SUMMARY OF THE INVENTION

I have found that submicron size vias and openings of high aspect ratio can be filled with aluminum-containing metal layers in a highly reliable, economically viable process comprising the following steps in sequence:
a) faceting the corners at the top of the opening;
b) sputter depositing and stuffing a barrier layer at the bottom of the opening;
c) depositing a thin layer of a titanium-containing wetting layer;
d) depositing a first layer of an aluminum-containing metal at low temperature and
e) depositing an aluminum-containing metal at elevated temperatures to fill the openings.

The above process can be carried out in an economically viable way by sputtering in a multichamber sputtering apparatus whereby the sequential steps c), d) and e) are carried out without removing the substrate from a high vacuum environment. The deposited lines and contacts are not subject to undue device failure and junction spiking is not encountered.

DETAILED DESCRIPTION OF THE INVENTION

The present multistep process ensures that openings and vias of submicron size and with high aspect ratios can be reliably filled with aluminum-containing metal layers having good planarization.

Figure 1:
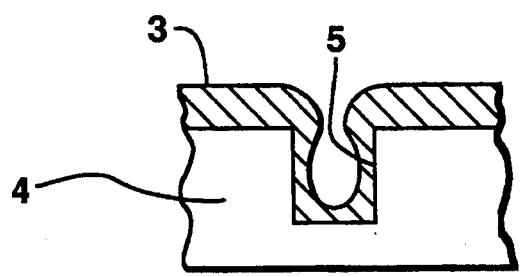
FIG. 1 is a cross sectional view of an opening being filled.
Figure 2:
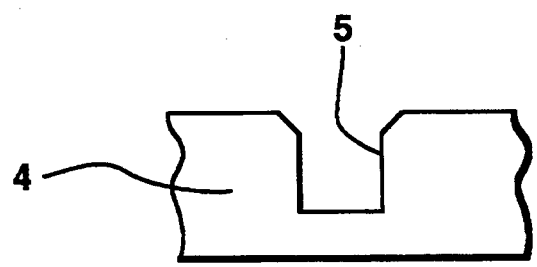
FIG. 2 is a cross sectional view of a faceted opening.

In a first process step, the contact openings are cleaned and the upper corner faceted. For openings in silicon oxide layers, sputter etching about 300 angstroms of the layer in argon plasma both removes the native oxide from the bottom of the contacts or vias and facets the corners of the openings, ensuring good intermetallic contacts as well as complete filling of the openings and the absence of any voids in the center of the filled openings. FIG. 2 illustrates a faceted contact opening 5 in a silicon oxide layer 4.

A first Ti/TiN barrier layer is next deposited into the bottom of the openings. The barrier layer is sputter deposited at high pressures in the 8-12 millitorr range. Since TiN layers deposited by sputtering are porous films rather than single crystal non-porous layers, the TiN layers are annealed, either in the presence of air or oxygen, or by exposure to elevated temperatures in an oxygen-containing nitrogen atmosphere to "stuff" the layer, or make it less porous. The barrier properties of this layer are thereby improved. This layer prevents aluminum spiking through the junction.

The subsequent layers are deposited sequentially, preferably without leaving an ultrahigh vacuum environment, i.e., a pressure of about $10^{-8}$ millitorr.

A titanium-containing wetting layer is next deposited onto the stuffed TiN layer. A layer of about 300-1000 angstroms in thickness is suitable. This layer can also be deposited by sputter deposition. Suitably this titanium-containing layer can be titanium, titanium nitride, titanium tungsten and the like. This layer is deposited to ensure the absence of voids in submicron openings of high aspect ratio and should not be exposed to air or oxygen prior to the deposition of the aluminum layers.

An aluminum-containing metal fill layer is next deposited in sequence in a multichamber high vacuum system in a two step process; the first deposition step is carried out at low temperatures, i.e., room temperature up to about 150° C., followed by a second deposition step at elevated temperatures, i.e., about 450°-500° C. Suitably these steps are also carried out by sputtering, for example at 2-9 KW of power for the first deposition step and at 2-4 KW of power for the second deposition step, both at about 2-4 millitorr pressure in a high vacuum sputtering chamber. The low temperature deposited seed layer ensures that dewetting of the subsequently deposited high temperature aluminum layer does not occur, again avoiding the formation of voids within the filled opening.

Preferably and in accordance with the invention, the above process is carried out in a high vacuum multichamber system, such as the "Endura 5000" multichamber sputtering system of Applied Materials of Santa Clara, Calif. This chamber will now be described in accordance with FIG. 3.

Figure 3:
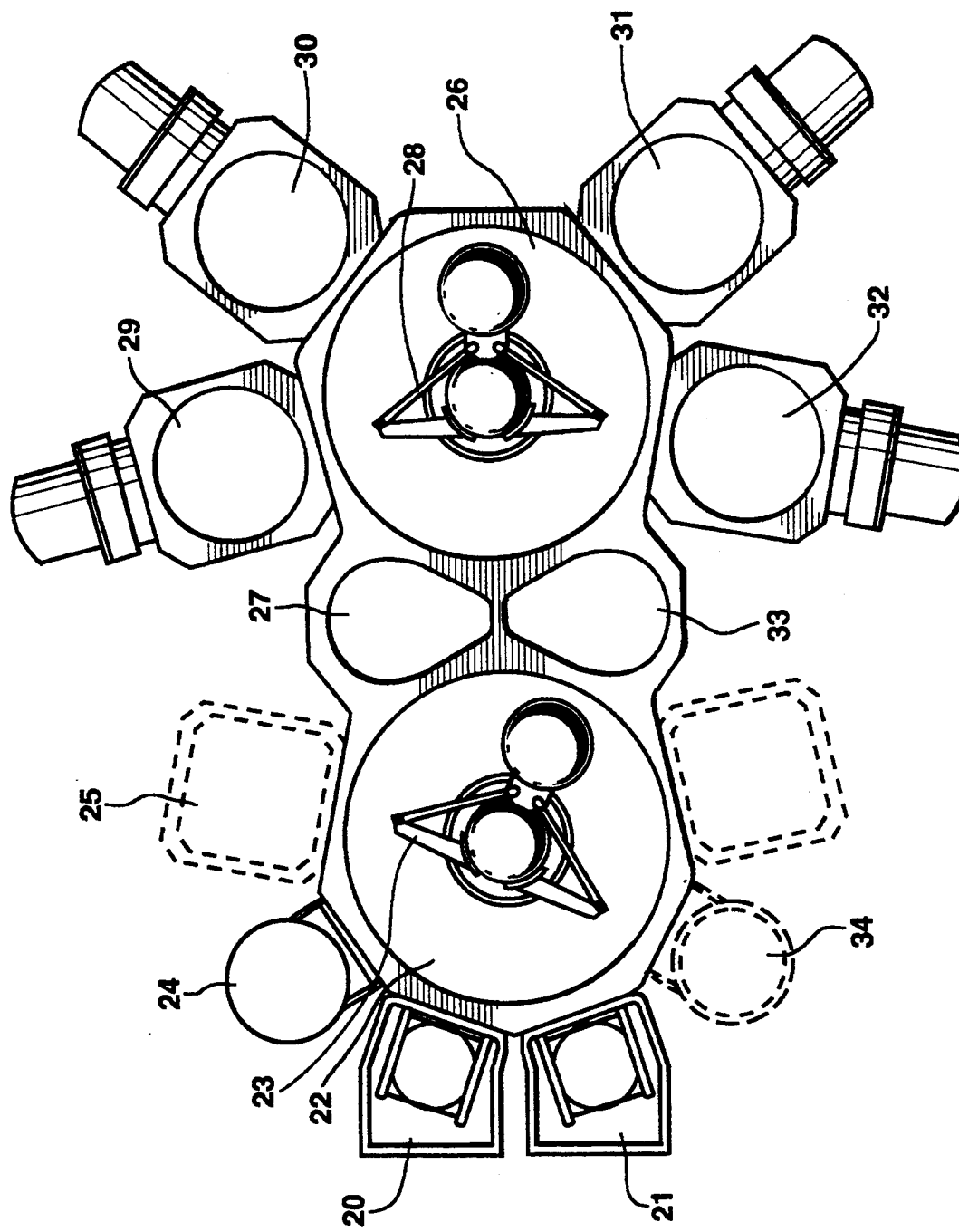
FIG. 3 is a block diagram of a suitable apparatus for carrying out the present process.

The system 10 of FIG. 3 is a multichamber apparatus comprising two independently operated loadlock chambers 20 and 21 for loading and unloading semiconductor wafer cassettes into the first wafer transfer chamber 22. The transfer chamber 22 is fitted with a two planar, two axis magnetically coupled robot 23 for transfer of the wafers to various of the chambers in the system 10. The transfer chamber 22 is interconnected with a degas-/orientation chamber 24 in which wafers are degassed by lamp heating to elevated temperatures. After degassing, the wafers are retrieved by the transfer chamber robot 23 and transferred to a sputter etch chamber 27 wherein the upper layer of oxide is removed by etching about 300 angstroms, which also facets the upper corners of the openings or vias in the wafer to improve filling of the openings.

The wafers are now ready for sputter deposition and are transferred from chamber 27 to the succeeding deposition chambers. Transfer chamber 26, also containing a wafer handling robot 28, is connected to a plurality of sputtering chambers shown as 29, 30, 31 and 32, which can carry out sputtering of various layers under various conditions of temperature, pressure and power independently of each other. Although four sputtering chambers are shown in FIG. 2, that number is optional depending upon the number of sequential sputtering depositions to be carried out.

In accordance with the present process, the sequential deposition of a Ti/TiN, Ti, TiN or TiW wetting layer, a low temperature aluminum and a high temperature aluminum layers, are carried out in the chambers 29-32. Stuffing of the TiN layers as hereinbefore described, can also be carried out in chamber 25 or any other anneal chamber in any suitable location. The filled wafers are then transferred by means of the robots 23 and 28 back to load lock chamber 21 via chamber 33, in which any additional temperature treatment may be carried out, optionally passing the wafer through a cooldown chamber 34 if desired.

As is known, additional chambers for carrying out additional etch or deposition steps, heat treatment, and the like can be added to the above system. The great advantage of the system 10 is that it can accommodate multiple step sputtering processes in which various layers may be deposited sequentially, all without leaving a high vacuum environment. This constitutes a great advance in the art of processing wafers one at a time, because the wafers do not need to be reconditioned for each sputtering step, and contamination of the wafers by particulates and gases is greatly reduced. In addition, the preservation of process control enhances process flexibility for throughput optimization and also provides better process control. Further it has been found that the use of such equipment ensures better control of film quality which may have potential impact on the electromigration and other device performance properties.

In accordance with the above description, titanium is used as a first wetting layer. Although we have found titanium to be the best material for the present purposes, other wetting agents are known such as polysilicon, tungsten and the like, and can be substituted if desired.

A collimation grating can be used for the cold or the hot aluminum deposition steps to improve deposition of this layer on the bottom of the vias and openings to be filled, particularly when such openings are of high aspect ratio, i.e., 1.5 or higher. The collimation grating improves the directionality of the sputtered ions to improve coverage at the bottom of openings or vias.

The invention will be further described by means of the following examples. The examples are illustrative only and the invention is not meant to be limited to the details described therein.

EXAMPLE 1

Test wafers patterned in known fashion to form vias and openings for aluminum contacts in an overlying silicon oxide layer were heated to about 250°-350° C. at about $1 \times 10^{-6}$ torr for about 60 seconds in degas chamber 24 in the system 10 Endura 5500 and transferred to the etch chamber 27 where about 300 angstroms of silicon oxide was etched off. This faceted the corners at the top of the contacts. The etch step was carried out at 300–400W of power using about 2 millitorr argon pressure. The etch time was 79 seconds.

About 300 angstroms of titanium was then sputter deposited to a depth of 300 angstroms at 3 millitorr pressure and 3 KW of power, and about 900 angstroms of TiN sputtered thereover at 12 millitorr pressure and 6.5 KW power.

The wafers were removed from the sputtering chamber and baked at about 450°–480° C. for thirty minutes in an oxygen-containing nitrogen ambient. This heating step "stuffs" the TiN layer and ensures good barrier properties of the TiN across the bottom of the contact opening to prevent spiking with the high temperature aluminum deposition step.

The wafers were then transferred to another sputtering chamber where an aluminum alloy ($AlSi_{1\%}Cu_{0.5\%}$) was deposited at 2 millitorr pressure and 9 KW of power at about 50°–150° C. A second hot deposition step followed at 550° C., 2–4 KW of power and 2 millitorr pressure in a separate sputtering chamber. The final aluminum alloy thickness was about 1.1 micron.

Testing of these wafers showed no aluminum spiking through the contacts. Complete filling of the contacts were achieved. The surface reflectivity of the film stack was about 190% relative to silicon at 436 nm, indicating smooth aluminum films. The sheet resistance of the film stack was 27 mohm/sq with average uniformity of <4%, as compared to the sheet resistance of $AlSi_{1\%}Cu_{0.5\%}$ alone of 25 mohm/sq.

EXAMPLE 2

The procedure of Example 1 was followed except that after the heat treatment, a first layer of Ti about 800 angstroms thick was deposited prior to aluminum deposition. The additional Ti layer allowed contact openings as small as 0.3 micron to be filled. The low temperature aluminum deposition was carried out at 50° C.

Surface reflectivity of the film stack was about 150% relative to silicon at 436 nm, indicating the presence of smooth reflective aluminum films, with no hillocks. The sheet resistance of the film stack is about 29 mohm/sq with average uniformity of <3%. These wafers are designated Batch A.

An additional batch of wafers were similarly processed except 750 angstroms of titanium was deposited prior to aluminum deposition by coherent deposition. This wafer batch is designated Batch B.

A third batch of wafers was processed as above except that the deposition of the titanium layer prior to aluminum deposition was omitted. This batch is designated Batch C.

Figure 4:
FIGS. 4, 5A–5B, and 6–11 are photomicrographs of filled contacts filled in accordance with the process of the invention and comparison contacts.
Figure 5A:
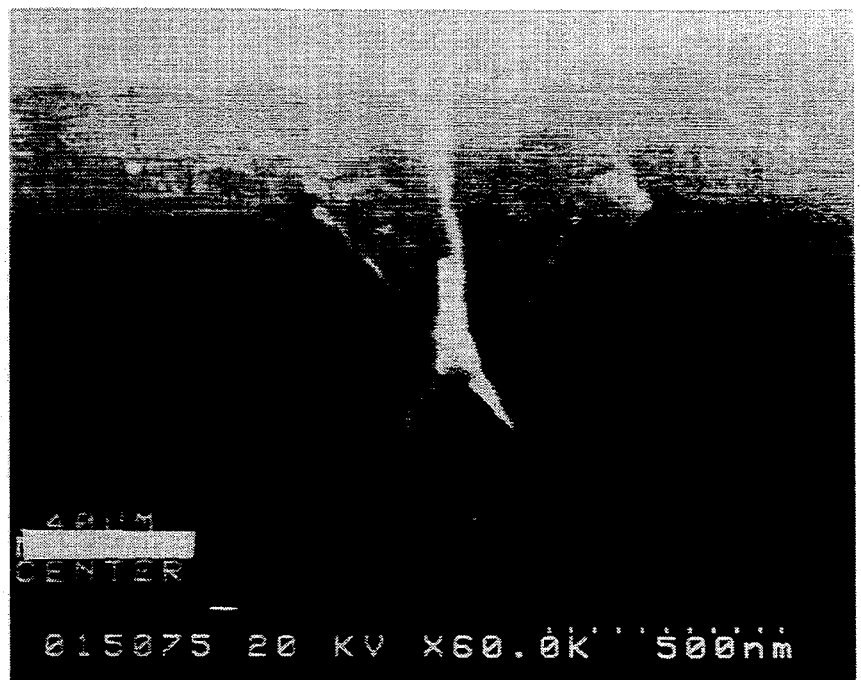
Figure 5B:
Figure 6:

FIG. 4 is a photomicrograph of a filled 0.60 micron wide contact of Batch A; FIGS. 5A and 5B are photomicrographs of a filled 40 micron wide contact of Batch A taken from the center of a wafer and near the edge of a wafer respectively. FIG. 6 is a photomicrograph of a filled 0.40 micron wide contact of Batch A. Excellent filling with no voids was obtained in all cases.

Figure 7:
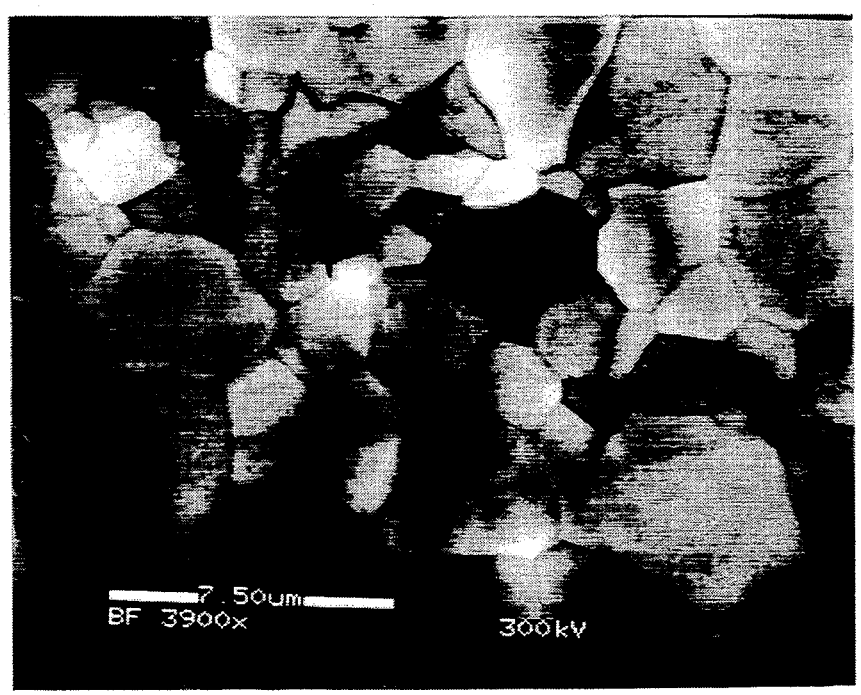

FIG. 7 is a photomicrograph of the surface of the aluminum layer of Batch B. The aluminum has a comparatively large grain size, generally about 1–5 microns.

Figure 8:
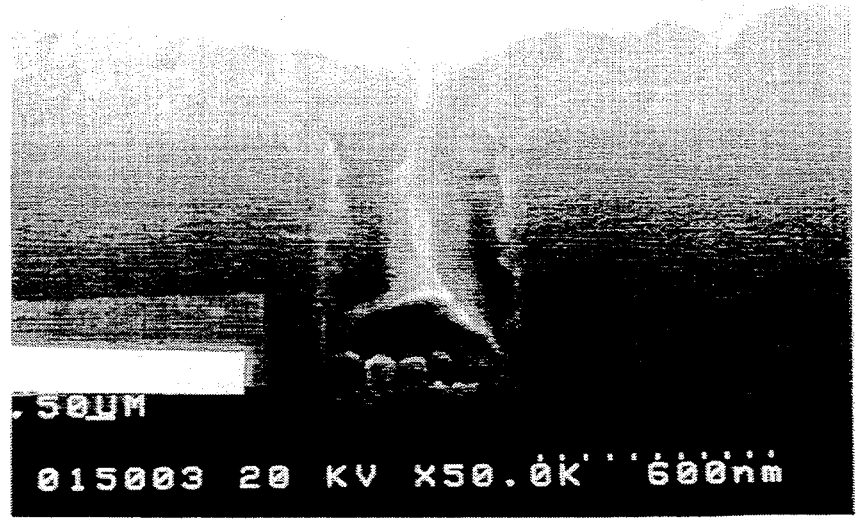
Figure 9:

FIG. 8 is a photomicrograph of a 0.50 micron wide contact of Batch B. FIG. 9 is a photomicrograph of a 0.30 micron wide contact of Batch B. Excellent filling of openings to 0.30 micron wide was obtained.

Figure 10:
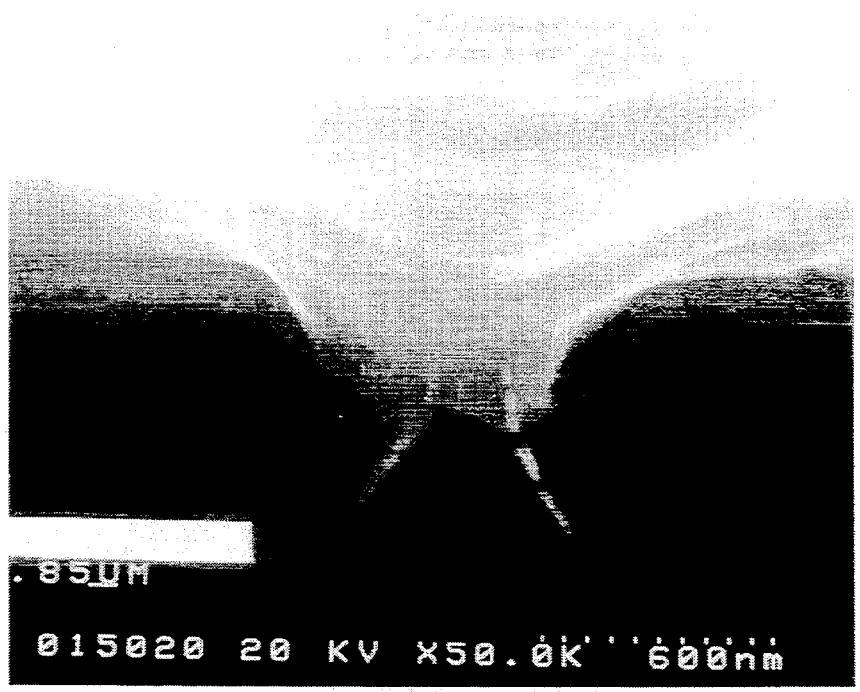
Figure 11:

FIGS. 10 and 11 are photomicrographs of Batch C. It is apparent that voids are found in openings 0.85 and 0.60 micron wide respectively when the titanium wetting layer is omitted.

Although the invention has been described in terms of particular embodiments and process conditions, variations may be made by one skilled in the art and are meant to be included herein. The invention is only to be limited by the appended claims.

I claim:

1. A method of filling vias and openings in semiconductor devices comprising
   a) faceting the upper corners of the openings;
   b) sputter depositing and stuffing a barrier layer at the bottom of the opening;
   c) depositing a thin layer of a wetting layer selected from the group consisting of titanium and compounds of titanium;
   d) depositing a first layer of an aluminum-containing metal at low temperature and
   c) depositing an aluminum-containing metal at elevated temperatures to fill the openings.

2. A method according to claim 1 wherein the openings are faceted by sputter etching.

3. A method according to claim 1 wherein the barrier layer is a titanium nitride layer.

4. A method according to claim 3 wherein said barrier layer is stuffed by heating in an oxygen-containing nitrogen atmosphere to form a less porous layer.

5. A method according to claim 1 wherein said low temperature aluminum layer is deposited using a collimation grating.

6. A method according to claim 1 wherein said high temperature aluminum layer is deposited using a collimation grating.

7. A method of filling vias and openings in semiconductor wafer substrates comprising the steps in sequence:
   a) transferring a wafer to a multichamber high vacuum system including one or more sputtering chambers;
   b) faceting the corners at the top of the opening;
   c) sputter depositing and stuffing a barrier layer at the bottom of the opening;
   d) depositing a thin layer of a wetting layer selected from the group consisting of titanium and compounds of titanium;
   e) depositing a first layer of an aluminum-containing metal at low temperature; and
   f) depositing a second layer of an aluminum-containing metal at elevated temperatures to fill the openings, the steps d), e) and f) carried out without leaving a vacuum environment.

8. A method of filling openings for contacts in semiconductor wafer substrates comprising:
   a) transferring a wafer to a multichamber high vacuum system including one or more sputtering chambers;
   b) sputter depositing and stuffing a barrier layer at the bottom of the opening;
   c) depositing a thin layer of a wetting layer selected from the group consisting of titanium and compounds of titanium;
   d) depositing a first layer of an aluminum-containing metal at low temperature, and
   e) depositing a second layer of an aluminum-containing metal at elevated temperatures to fill the openings so that during steps c), d) and e) the wafer does not leave a vacuum environment.

9. A method of filling vias in semiconductor wafer substrates comprising:
    a) transferring a wafer to a multichamber high vacuum system including one or more sputtering chambers;
    b) faceting the corners at the top of the via;
    c) depositing a thin layer of a wetting layer selected from the group consisting of titanium and compounds of titanium;
    d) depositing a first layer of an aluminum-containing metal at low temperature; and
    e) depositing a second layer of an aluminum-containing metal at elevated temperatures to fill the vias, the steps carried out without leaving a vacuum environment.

10. A method according to claim 1 wherein said wetting layer is deposited using a collimation grating.

11. A method according to claim 1 wherein said low temperature aluminum layer and said high temperature aluminum layer are deposited using a collimation grating.

12. A method according to claim 1 wherein said wetting layer, said low temperature aluminum layer and said high temperature aluminum layer are deposited using a collimation grating.

13. A method of filling vias and openings in a semiconductor wafer substrate comprising in sequence:
    a) transferring a wafer to a multichamber high vacuum system including one or more sputtering chambers;
    b) depositing a thin layer of a wetting layer selected from the group consisting of titanium and compounds of titanium;
    c) depositing a first layer of an aluminum-containing metal at low temperature; and
    d) depositing a second layer of an aluminum-containing metal at elevated temperatures to fill the openings, the steps carried out without leaving a vacuum environment.

14. A method according to claim 13 wherein one or more of said layers are deposited using a collimation grating.

15. A method according to claim 7 wherein one or more of said layers are deposited using a collimation grating.

16. A method according to claim 8 wherein one or more of said layers are deposited using a collimation grating.

17. A method according to claim 9 wherein one or more of said layers are deposited using a collimation grating.

* * * * *